United States Patent
Hasunuma et al.

(10) Patent No.: US 7,601,638 B2
(45) Date of Patent: Oct. 13, 2009

(54) INTERCONNECT METALLIZATION METHOD HAVING THERMALLY TREATED COPPER PLATE FILM WITH REDUCED MICRO-VOIDS

(75) Inventors: Masahiko Hasunuma, Yokohama (JP); Hisashi Kaneko, Fujisawa (JP); Hiroshi Toyoda, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 11/926,614

(22) Filed: Oct. 29, 2007

(65) Prior Publication Data
US 2008/0102628 A1    May 1, 2008

(30) Foreign Application Priority Data
Oct. 30, 2006 (JP) ............................ P2006-293488

(51) Int. Cl.
*H01L 21/4763* (2006.01)
(52) U.S. Cl. ............................... 438/660; 257/E21.495
(58) Field of Classification Search ................ 438/660; 257/E21.495
See application file for complete search history.

(56) References Cited
U.S. PATENT DOCUMENTS

| | | | |
|---|---|---|---|
| 6,235,406 B1 * | 5/2001 | Uzoh | .......................... 428/620 |
| 6,949,832 B2 | 9/2005 | Kunishima et al. | |
| 2004/0079646 A1 * | 4/2004 | Hirao | .......................... 205/137 |
| 2004/0231996 A1 * | 11/2004 | Webb et al. | .................. 205/137 |
| 2005/0095847 A1 | 5/2005 | Kunishima et al. | |
| 2005/0272258 A1 | 12/2005 | Morita et al. | |
| 2006/0027931 A1 | 2/2006 | Takewaki et al. | |
| 2006/0237319 A1 * | 10/2006 | Furuya et al. | .................. 205/96 |
| 2007/0080067 A1 * | 4/2007 | Gu et al. | ...................... 205/183 |

FOREIGN PATENT DOCUMENTS

| | | |
|---|---|---|
| CN | 1494129 A | 5/2004 |
| JP | 2004-40022 | 2/2004 |
| JP | 2005-223059 | 8/2005 |

* cited by examiner

*Primary Examiner*—Matthew Smith
*Assistant Examiner*—Walter H Swanson
(74) *Attorney, Agent, or Firm*—Finnegan, Henderson, Farabow, Garrett & Dunner, L.L.P.

(57) ABSTRACT

A method for manufacturing a semiconductor device includes forming, on a substrate having a recessed portion on a surface, a plating film which is at least buried in the recessed portion and has a higher impurity concentration in an upper portion than in a lower portion, thermally treating the plating film, and removing the thermally treated plating film except for a portion buried in the recessed portion.

10 Claims, 10 Drawing Sheets

|  | STEP 1 | | | STEP 2 | | | STEP 3 | | | RESULT | |
|---|---|---|---|---|---|---|---|---|---|---|---|
|  | CURRENT DENSITY | FILM THICKNESS | IMPURITY CONCENTRATION | CURRENT DENSITY | FILM THICKNESS | IMPURITY CONCENTRATION | CURRENT DENSITY | FILM THICKNESS | IMPURITY CONCENTRATION | DEFECT AMOUNT | SIV PERCENT DEFECTIVE |
| EXAMPLE 3 | 0.1A/cm² | ×1.2 | 4×10¹⁸ atoms/cc | ×1/3 | bal. | ×5 | — | — | — | ○ | ○ |
| EXAMPLE 4 | 0.1A/cm² | ×1.0 | 4×10¹⁸ atoms/cc | ×1/3 | bal. | ×5 | — | — | — | × | ○ |
| EXAMPLE 5 | 0.1A/cm² | ×0.8 | 4×10¹⁸ atoms/cc | ×1/3 | bal. | ×5 | — | — | — | × | ○ |
| EXAMPLE 6 | 0.1A/cm² | ×1.4 | 4×10¹⁸ atoms/cc | ×1/3 | bal. | ×2 | — | — | — | ○ | ○ |
| EXAMPLE 7 | 0.1A/cm² | ×1.2 | 4×10¹⁸ atoms/cc | ×3/4 | bal. | ×1.5 | — | — | — | ○ | ○ |
| EXAMPLE 8 | 0.1A/cm² | ×1.2 | 4×10¹⁸ atoms/cc | ×4/5 | 0.2μm | ×5 | ×3 | bal. | ×1/2 | ○ | ○ |
| EXAMPLE 9 | 0.1A/cm² | ×1.2 | 4×10¹⁸ atoms/cc | ×1/3 | bal. | ×1/3 | — | — | — | △ | × |
| COMPARATIVE EXAMPLE 2 | 0.03A/cm² | ×0.5 | 1×10¹⁹ atoms/cc | ×3 | bal. | ×1 | — | — | — | △ | × |
| COMPARATIVE EXAMPLE 3 | 0.1A/cm² | ×1.0 | 4×10¹⁸ atoms/cc | ×1 | bal. | ×1 | — | — | — | × | △ |

FIG. 20

|  | STEP 1 ||| STEP 2 ||| RESULT ||
|---|---|---|---|---|---|---|---|---|
|  | WAFER ROTATIONAL FREQUENCY | FILM THICKNESS | IMPURITY CONCENTRATION | WAFER ROTATIONAL FREQUENCY | FILM THICKNESS | IMPURITY CONCENTRATION | DEFECT AMOUNT | SIV PERCENT DEFECTIVE |
| EXAMPLE 10 | 80rpm | ×1.2 | $4 \times 10^{18}$ atoms/cc | ×2 | bal. | ×3 | ○ | ○ |
| EXAMPLE 11 | 80rpm | ×1.0 | $4 \times 10^{18}$ atoms/cc | ×2 | bal. | ×3 | × | ○ |
| EXAMPLE 12 | 80rpm | ×0.8 | $4 \times 10^{18}$ atoms/cc | ×2 | bal. | ×3 | × | ○ |
| EXAMPLE 13 | 80rpm | ×1.4 | $4 \times 10^{18}$ atoms/cc | ×2 | bal. | ×3 | ○ | ○ |
| EXAMPLE 14 | 80rpm | ×1.2 | $4 \times 10^{18}$ atoms/cc | ×1.2 | bal. | ×2 | ○ | ○ |
| EXAMPLE 15 | 80rpm | ×1.2 | $4 \times 10^{18}$ atoms/cc | ×1.5 | bal. | ×1.5 | ○ | ○ |

INTERCONNECT METALLIZATION METHOD HAVING THERMALLY TREATED COPPER PLATE FILM WITH REDUCED MICRO-VOIDS

CROSS-REFERENCE TO RELATED APPLICATIONS

This application is based upon and claims the benefit of priority from the prior Japanese Patent Application No. 2006-293488, filed on Oct. 30, 2006; the entire contents of which are incorporated herein by reference.

BACKGROUND OF THE INVENTION

1. Field of the Invention

The present invention relates to a method for manufacturing a semiconductor device.

2. Description of the Related Art

In recent years, as wirings of semiconductor devices, Cu has been used instead of Al, for the purpose of enhancing resistance against migrations such as electromigration (EM) and stress migration (SM) which become the causes of reduction in wiring resistance and wiring failure.

Processing by RIE (reactive ion etching) as is performed for Al is difficult to perform for Cu. Therefore, a damascene method is used for formation of a Cu wiring. In the damascene method, a wiring groove and a via hole are formed in advance in the surface of an insulating film, and a Cu film is formed on the insulating film, whereby Cu is buried in the wiring groove and via hole. Thereafter, an unnecessary Cu film is removed by chemical mechanical polishing, and the Cu wiring is formed.

For formation of the Cu film by a damascene method, electrolytic plating is widely used. In order to improve burying property and flatness of the Cu film surface, predetermined amounts of additives such as an accelerator, a suppressor and a leveler are included in a plating solution used for electrolytic plating, in addition to Cu ions, for example. These additives are taken in the Cu film as impurities.

Incidentally, as the factor which degrades the reliability of a wiring, micro-voids which occur at the time of formation of a Cu film are conceivable. Micro-voids become the initial voids of an EM defect and an SM defect. If the initial voids exist, voids grow during supplying a current to the wiring or keeping the wiring at a high temperature, and EM reliability and SM reliability are significantly reduced. Therefore, the measures to suppress occurrence of micro-voids are desired.

Here, the art of forming a metal film containing bias sputter copper containing different kinds of elements on a plated copper film is disclosed (see JP-A 2004-40022 (KOKAI)). According to the art, different kinds of elements diffuse in the plated copper film by thermal treatment, and therefore, EM reliability and SM reliability can be enhanced. However, different kinds of metals diffuse in the copper film in parallel or behind the crystal grain growth of Cu by thermal treatment, and therefore, void growth at the time of thermal treatment is difficult to inhibit. Since the film growing methods of the plated copper film and the metal film containing bias sputter copper differ from each other, they are divided into two layers. Accordingly, when such a plated copper film and a metal film containing bias sputter copper are thermally treated, the crystal grain growth of Cu starts from the portion near an interface with the metal film containing bias sputter copper in the plated copper film, the crystal defect existing in the plated copper film is not eliminated, and there is the fear of occurrence of micro-voids.

BRIEF SUMMARY OF THE INVENTION

A method for manufacturing a semiconductor device according to one mode of the present invention includes forming, on a substrate having a recessed portion on a surface, a plating film which is at least buried in the recessed portion and has a higher impurity concentration in an upper portion than in a lower portion, thermally treating the plating film, and removing the thermally treated plating film except for a portion buried in the recessed portion.

A method for manufacturing a semiconductor device according to one mode of the present invention includes forming, on a substrate having a recessed portion on a surface, a plating film which is at least buried in the recessed portion by performing electrolytic plating while decreasing a current density or applied voltage stepwise, thermally treating the plating film, and removing the thermally treated plating film except for a portion buried in the recessed portion.

A method for manufacturing a semiconductor device according to one mode of the present invention includes forming, on a substrate having a recessed portion on a surface, a plating film which is at least buried in the recessed portion by performing plating while rotating the substrate and increasing its rotational frequency continuously or stepwise, thermally treating the plating film, and removing the thermally treated plating film except for a portion buried in the recessed portion.

DETAILED DESCRIPTION OF THE INVENTION

First Embodiment

Figure 1:
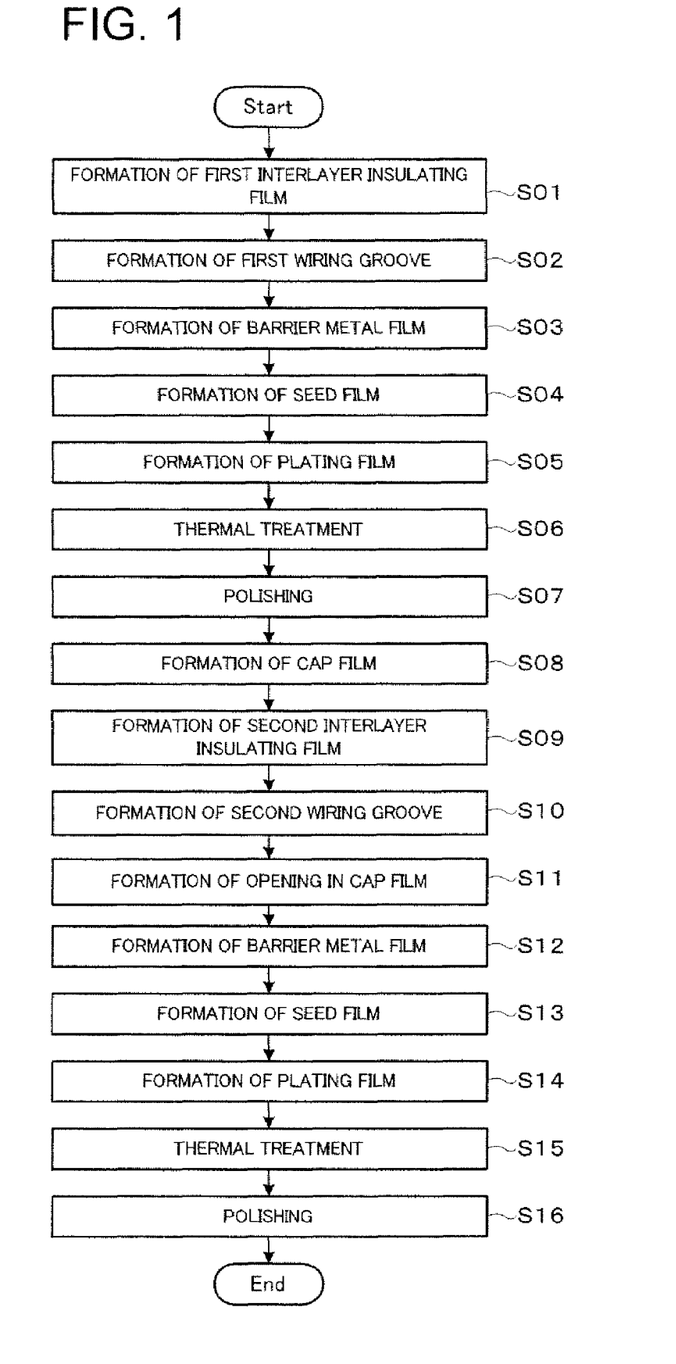
FIG. 1 is a flowchart showing one example of a manufacturing process of a semiconductor device according to a first embodiment.

Hereinafter, a first embodiment will be described. FIG. 1 is a flow chart showing an example of a manufacturing process of a semiconductor device according to the first embodiment. FIGS. 2 to 17 are schematic views showing the semiconductor device manufactured in the manufacturing process shown in FIG. 1. FIG. 18 is a schematic outline view of a plating apparatus according to the embodiment.

Figure 2:
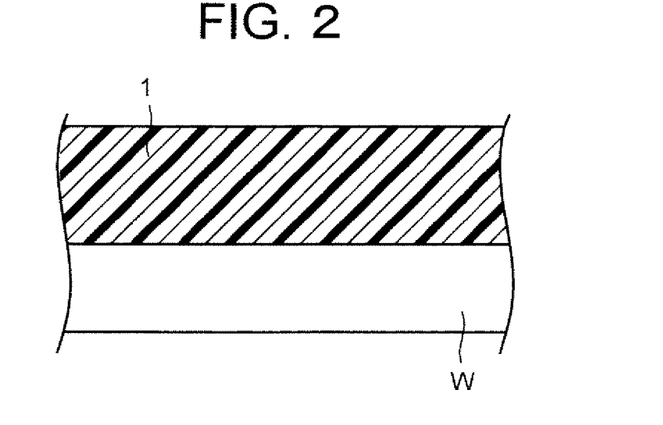
FIGS. 2 to 17 are schematic views showing the semiconductor device manufactured by the manufacturing process shown in FIG. 1.

An interlayer insulating film is formed on a semiconductor wafer W (hereinafter, simply called "wafer") having an active part (not shown) such as, for example, a transistor by, for example, a chemical vapor deposition (Chemical Vapor Deposition: CVD) method or a coating method as shown in FIG. 2 (step S01). As the composing material of the interlayer insulating film 1, for example, a low dielectric constant insulation material such as an organic Si oxide, an organic resin and a porous Si oxide, $SiO_2$ and the like are cited.

Figure 3:
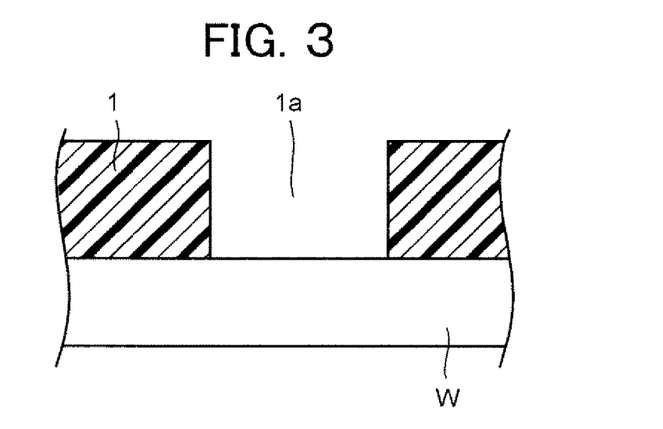

After the interlayer insulating film 1 is formed, a first layer wiring groove 1a as a recessed portion is formed in the interlayer insulating film 1 by a photolithography technique and a reactive ion etching (RIE) as shown in FIG. 3 (step S02). In order to form the first layer wiring groove 1a, a chemically amplified photoresist is coated through an antireflection film or a hard mask of SiN, $SiO_2$ or the like on the interlayer insulating film 1 while the wafer W is rotated. After the photoresist is coated, exposure with ultraviolet rays is performed by using a mask with a predetermined pattern formed therein. Thereafter, development is performed by a developing solution, and a resist pattern is formed on the interlayer insulating film 1. After the resist pattern is formed on the interlayer insulating film 1, etching is performed for the interlayer insulating film I by RIE with the resist pattern as a mask, and the first layer wiring groove 1*a* is formed. After the first layer wiring groove 1*a* is formed in the interlayer insulating film 1, the resist and the antireflection film are removed by ashing or the like.

Figure 4:
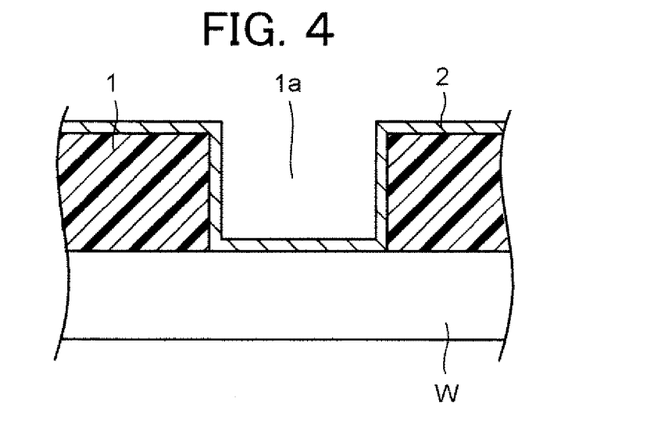

After the first layer wiring groove 1*a* is formed in the interlayer insulating film 1, a barrier metal film 2 for suppressing metal diffusion to the interlayer insulating film 1 is formed on the interlayer insulating film 1 by, for example, a sputtering method or a CVD method as shown in FIG. 4 (step S03). As a composing material of the barrier metal film 2, a conductive material such as, for example, Ta, Ti, TaN, TiN, NbN, WN, or VN is cited. The barrier metal film 2 may be formed by stacking these materials. Moreover, a catalyst metal such as Ru, and Pd for improving a burying property of the upper layer can be added to these materials. Furthermore, a film of the catalyst metal can be laminated.

Figure 5:
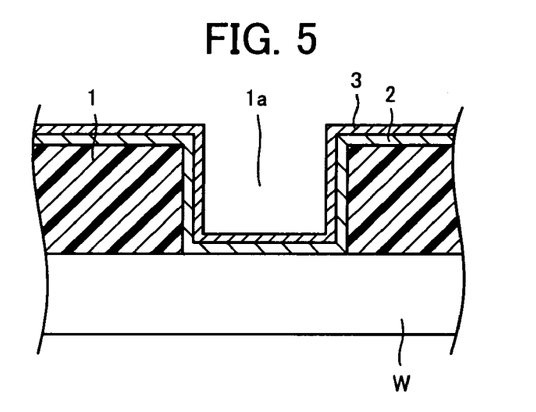

After the barrier metal film 2 is formed on the interlayer insulating film 1, a seed film 3 for passing a current at the time of electrolytic plating is formed on the barrier metal film 2 by, for example, a sputtering method as shown in FIG. 5 (step S04). As a composing material of the seed film 3, a metal such as Cu, for example, is cited. The seed film 3 may be formed by any one of an electroless plating method, an electrolytic plating method and a CVD method, without being limited to the sputtering method. And alloys of Cu added Al, Ti, Sn, or the like can be used at a viewpoint of improving a reliability of the semiconductor device.

Figure 6:
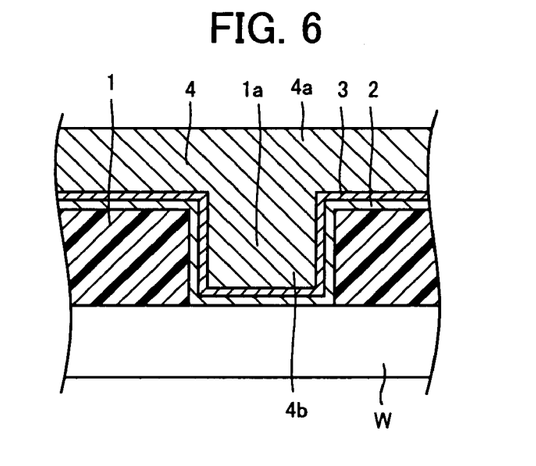

After the seed film 3 is formed on the barrier metal film 2, a plating solution is supplied to the surface of the seed film 3, and a plating film 4 is formed on the seed film 3 by, for example, an electrolytic plating method as shown in FIG. 6 (step S05). The plating film may be formed by an electroless plating method, without being limited to the electrolytic method.

In order to form the plating film 4, a voltage is first applied between the wafer W and an anode 21 with the wafer W as a cathode with the wafer W held by a holder 20 so that the seed film 3 becomes an undersurface as shown in FIG. 18. In the case of electrolytic plating with current control, the current which is supplied to the wafer W is made constant, whereas in the case of electrolytic plating with voltage control, the applied voltage between the wafer w and the anode is made constant.

Thereafter, the wafer W is tilted, and the wafer W is soaked in the plating solution in a plating solution bath 22. At this time, the wafer W is rotated in order to suppress adsorption of bubbles to the wafer surface, and in order to form the plating film 4 uniformly. If bubble adsorption can be suppressed by contriving a soaking method or the like, the wafer W may be soaked in the plating solution without being rotated. Predetermined amounts of additives such as an accelerator, a suppressor, a leveler and the like are included in the plating solution in addition to metallic ions such as, for example, Cu ions.

For example, in the case of electrolytic plating with current control, the plating film 4 is formed while the current density is reduced stepwise. In the case of electrolytic plating with voltage control, the plating film 4 is formed while the applied voltage is reduced stepwise. The plating film may be formed while the rotational frequency of the wafer W is increased stepwise with reducing the current density or the applied voltage stepwise, or instead of reducing the current density or the applied voltage.

At least any one of the current density or the applied voltage, and the rotational frequency of the wafer at the time of forming the plating film 4 is switched in the position where the plating film 4 is at the height of the depth of the first layer wiring groove 1*a* or larger from the bottom surface of the first layer wiring groove 1*a*, more preferably, at the height which is 1.2 times as large as or larger than the depth of the first layer wiring groove 1*a*. When a plurality of first layer wiring grooves 1*a* are formed, the current density or the like is switched in the position where the plating film 4 is at the height of the depth of the first layer wiring grooves 1*a* or larger from the bottom surfaces of the first layer wiring grooves 1*a* in all the first layer wiring grooves 1*a*.

The plating film 4 thus formed is mainly composed of a metal such as Cu, but impurities are included in it. Here, the impurity concentration in an upper portion 4*a* of the plating film 4 is higher than the impurity concentration in a lower portion 4*b*. "Impurity" is a substance having at least any of S, Cl, O, C and N. The impurity is included in the plating film 4 at the time of plating film forming process.

Figure 7:
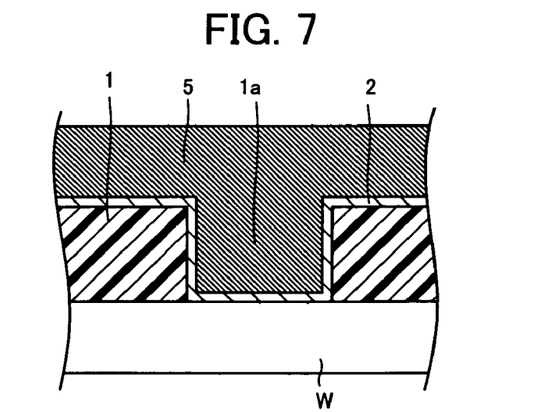

After the plating film 4 is formed on the seed film 3, thermal treatment is applied to the wafer W, crystals of the seed film 3 and the plating film 4 are grown, and a wiring film 5 is formed as shown in FIG. 7 (step S06). The thermal treatment is performed at, for example, 150 to 300° C. for 30 seconds to 60 minutes.

Figure 8:
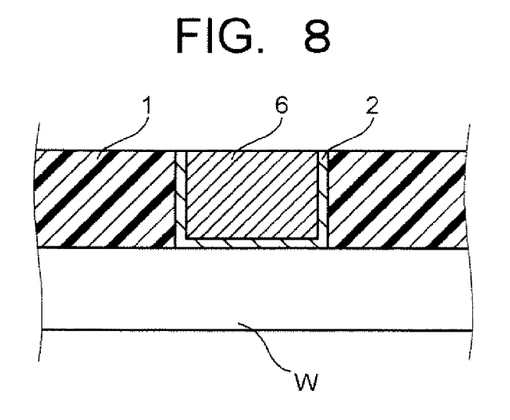

After the thermal treatment is applied to the wafer W, the wafer W is polished by, for example, chemical mechanical polishing (Chemical Mechanical Polishing: CMP), and the unnecessary barrier metal film 2 and wiring film 5 on the interlayer insulating film 1 are respectively removed so that the barrier metal film 2 and the wiring film 5 existing in the first layer wiring groove 1*a* remain respectively as shown in FIG. 8 (step S07). Polishing may be performed by other methods without being limited to CMP. As the other methods, for example, electrolytic polishing is cited. Thereby, a first layer wiring 6 is formed in the first layer wiring groove 1*a*. The impurity concentration of the first layer wiring 6 is substantially uniform as a whole.

Figure 9:
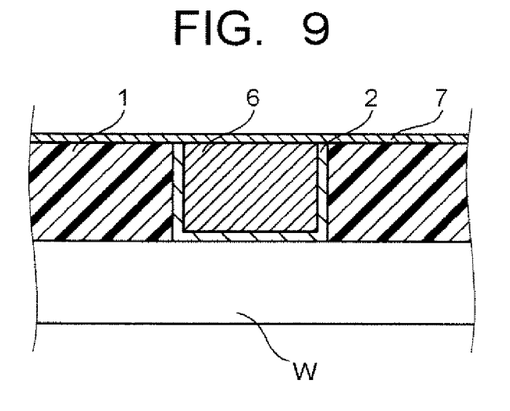

After the first layer wiring 6 is formed, a cap film 7 is formed on the interlayer insulating film 1 and the first layer wiring 6 by, for example, a plasma CVD method as shown in FIG. 9 (step S08). As a composing material of the cap film 7, for example, SiC or the like is cited.

Figure 10:
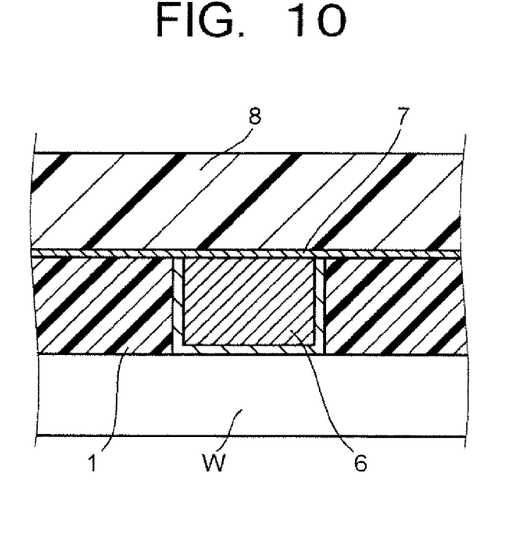

After the cap film 7 is formed on the interlayer insulating film 1, an interlayer insulating film 8 is formed on the cap film 7 by, for example, a chemical vapor deposition (Chemical Vapor Deposition: CVD) or a coating method as shown in FIG. 10 (step S09).

Figure 11:
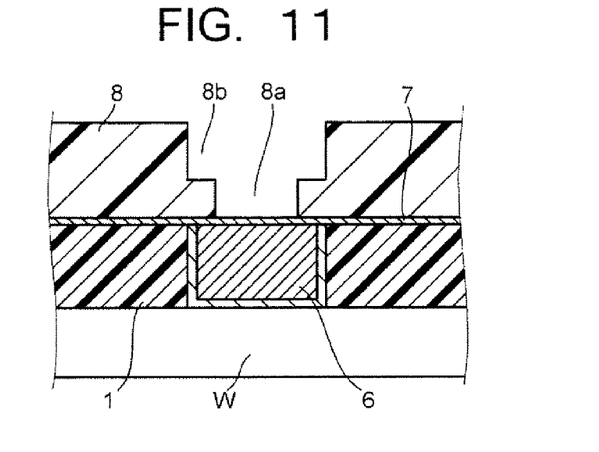

After the interlayer insulating film 8 is formed, a via hole 8*a* and a second layer wiring groove 8*b* are formed in the interlayer insulating film 8 by a photolithography technique and a reactive ion etching (RIE) as shown in FIG. 11 (step S10).

Figure 12:
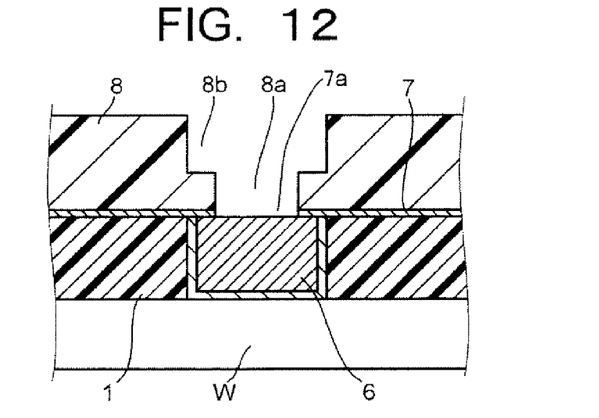
Figure 13:
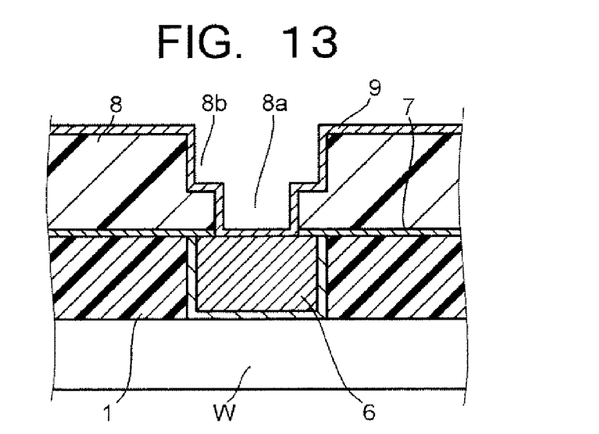

After the via hole 8*a* and the second layer wiring groove 8*b* are formed in the interlayer insulating film 8, an opening 7*a* is formed in the portion of the cap film 7 located directly under the via hole 8*a* as shown in FIG. 12 (step S11). Thereafter, a barrier metal film 9 for suppressing metal diffusion to the interlayer insulating film 8 is formed on the interlayer insulating film 8 by, for example, a sputtering method or a CVD method as shown in FIG. 13 (step S12). As a composing material of the barrier metal film 9, the same material as the composing material of the barrier metal film 2 is cited.

Figure 14:
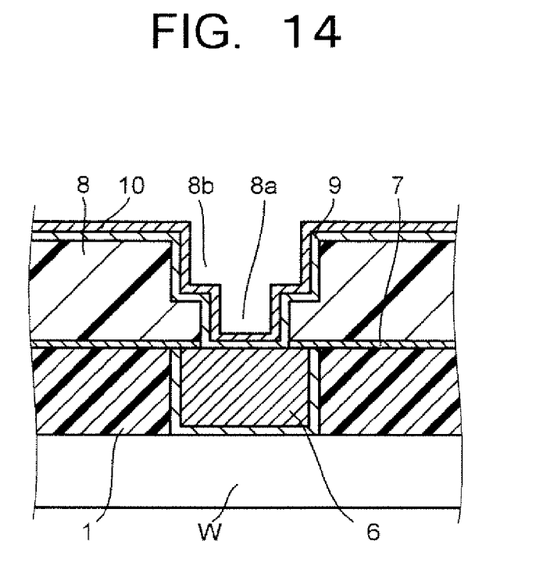

After the barrier metal film 9 is formed on the interlayer insulating film 8, a seed film 10 for passing a current at the time of electrolytic plating is formed on the barrier metal film 9 by, for example, a sputtering method as shown in FIG. 14 (step S13). As the composing material of the seed film 10, the same material as the composing material of the seed film 3 is cited.

Figure 15:
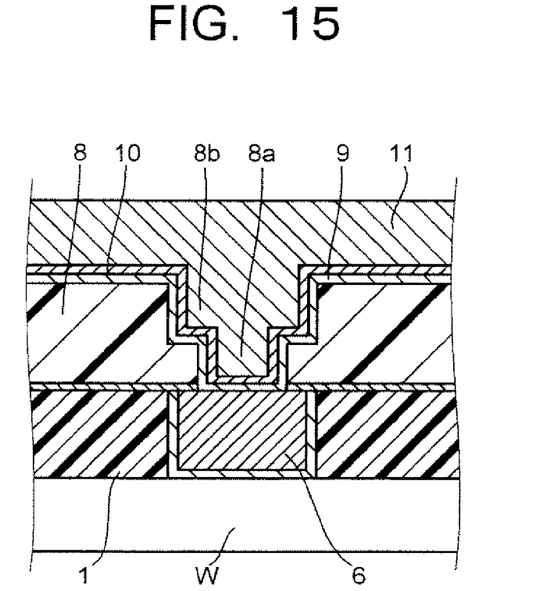

After the seed film 10 is formed on the barrier metal film 9, a plating solution is supplied to the surface of the seed film 10 as shown in FIG. 15, and a plating film 11 is formed on the seed film 10 by, for example, an electrolytic plating method (step S14). The plating film 11 is formed by the similar method to that of the plating film 4. As the composing material of the plating film 11, the similar material to the composing material of the plating film 4 is cited.

Figure 16:
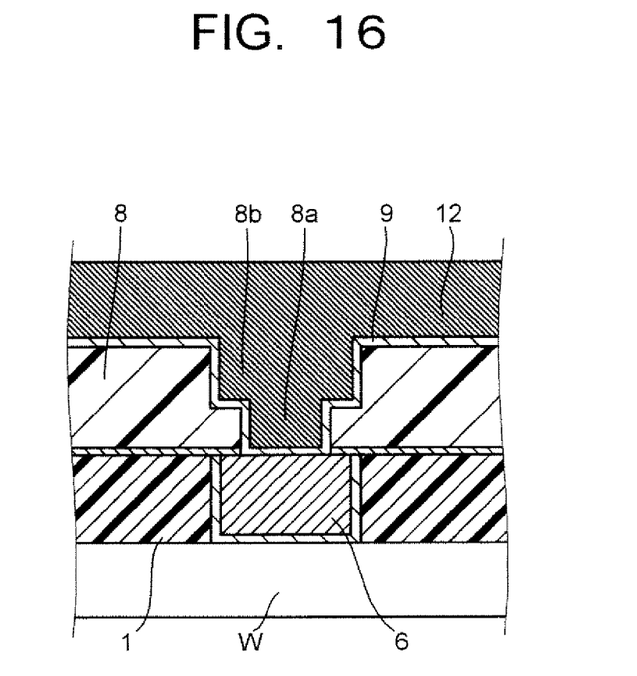

After the plating film 11 is formed on the seed film 10, thermal treatment is applied to the wafer W, the crystals of the seed film 10 and the plating film 11 are grown, and a wiring film 12 is formed as shown in FIG. 16 (step S15). The thermal treatment is performed, for example, at 150 to 300° C. for 30 seconds to 60 minutes.

Figure 17:
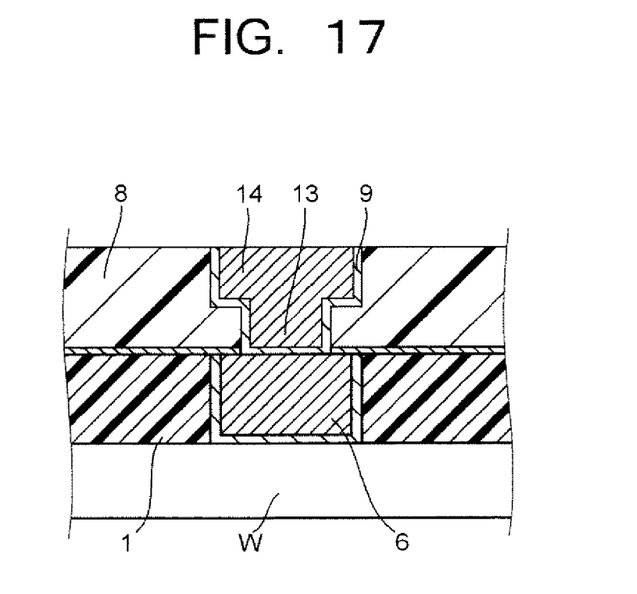
Figure 18:
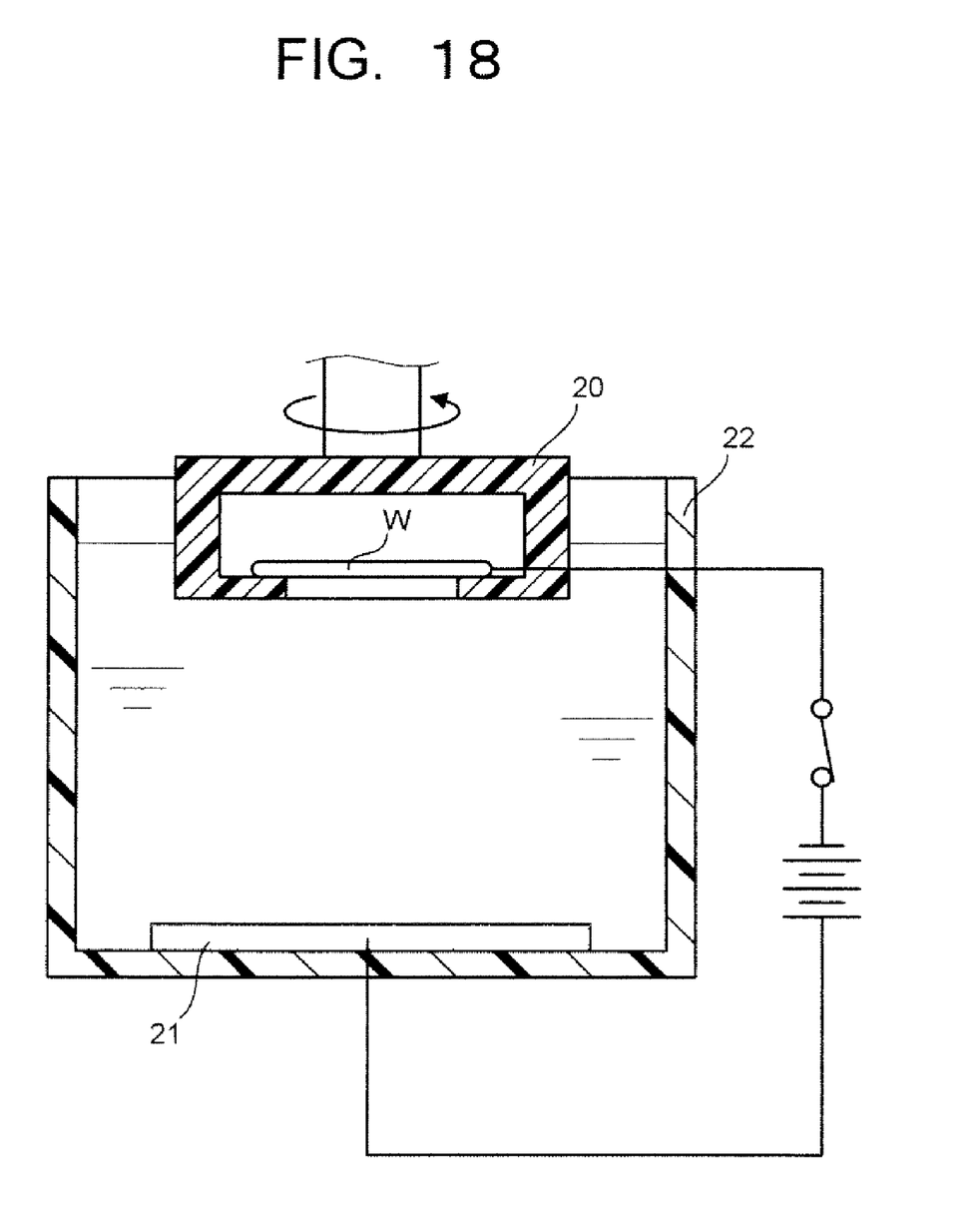
FIG. 18 is a schematic outline view of a plating apparatus according to the first embodiment.

After the thermal treatment is applied to the wafer W, the unnecessary barrier metal film 9 and the wiring film 12 on the interlayer insulating film 8 are respectively removed so that the barrier metal film 9 and the wiring film 12 existing in the via hole 8a and the second layer wiring groove 8b remain respectively as shown in FIG. 17 by polishing them by, for example, a chemical mechanical polishing (Chemical Mechanical Polishing: CMP (step S16). Thereby, a via plug 13 is formed in the via hole 8a, and a second layer wiring 14 is formed in the second layer wiring groove 5b. The impurity concentration of the second layer wiring 14 is substantially uniform as a whole.

There is a correlation between the impurity concentration in a plating film and the crystal grain growth speed of the plating film. In concrete, as the impurity concentration is lower, the crystal grain growth becomes faster, and as the impurity concentration is higher, the crystal grain growth becomes slower. This is considered to be the result of the impurities hindering movement and dislocation of crystal grain boundaries and movement of crystal defects such as a vacancy during crystal grain growth.

The impurity concentration significantly varies in accordance with the process at the time of forming a plating film. Generally, the impurity concentration becomes lower by increasing plating speed of the plating film. For example, as the current density or the applied voltage at the time of forming a plating film is lower, the impurity concentration becomes higher, and as the current density or the applied voltage is higher, the impurity concentration becomes lower. As the rotational frequency of the wafer at the time of forming a plating film is lower, the impurity concentration becomes lower, and as the rotational frequency of the wafer is higher, the impurity concentration becomes higher.

Accordingly, when the current density or the applied voltage at the time of forming the plating film is made high, for example, the impurity concentration becomes low, and the crystal grain growth becomes fast. On the other hand, when the current density or the applied voltage at the time of forming the plating film is made low, for example, the impurity concentration becomes high, and the crystal grain growth becomes slow.

The present inventors clarified the occurrence of voids as follows. In concrete, recrystallization and grain growth of crystal grain generally occur with interfaces of different kinds and different phases as starting points, and in the case of a film, a base interface, a film surface, and a foreign substance in the film become the starting points. When crystal grain growth occurs from a film surface, a large amount of crystal defects swept out with growth concentrates inside the film, and micro-voids are formed to be crystal grain boundaries or the like with high in-film energy. It is conceivable that crystal defects following the crystal grain growth thereafter further concentrate at the lower portion of the film, and these micro-voids form voids at the time of subsequent standing at a room temperature and metal annealing, and thermal treatment at the time of forming an interlayer insulating film, and at the time of SIV (Stress Induced Voiding) acceleration test, and cause wiring failure.

The inventors have found out that with respect to such a defect, crystal grain growth is caused from the lower portion of the plating film, whereby the crystal defect is swept out in the direction of the surface of the plating film following the crystal grain growth, and the crystal defects existing in the portion in the wiring groove functioning as a wiring are reduced.

In this embodiment, the plating film 4 is formed while the current density or the applied voltage is reduced stepwise, or the rotational frequency of the wafer W is increased stepwise, and the impurity concentration of the upper portion 4a is made higher than the impurity concentration of the lower portion 4b. Therefore, when the plating film 4 is thermally treated, the crystal grain grows from the lower portion 4b of the plating film 4. As a result, the crystal defect existing in the lower portion 4b of the plating film 4 moves in the direction of the surface of the plating film 4, and therefore, the crystal defect in the portion of the plating film 4 in the first layer wiring groove 1a is reduced. Therefore, the micro-voids in the first layer wiring 6 can be reduced, and reliability of the wiring can be enhanced. Further, with respect to the via plug 13 and the second layer wiring 14, reliability can be enhanced by the similar method. When the impurity concentration of the plating film 4 is higher in the lower portion 4b than in the upper portion 4a, crystal grain growth occurs from the upper portion 4a, and therefore, the crystal defect in the lower portion 4b is difficult to eliminate. When the impurity concentration of the plating film 4 is uniform, crystal grain growth occurs from the upper portion 4a as well as the lower portion 4b, and therefore, the crystal defect of the lower portion 4b is difficult to eliminate.

Switching stepwise the current density or the like at the time of forming a plating film is controlled more easily than switching continuously the current density of electrolytic plating with current control. On the other hand, when the current density or the like is switched stepwise, the impurity concentration near the boundary where the current density or the like is switched tends to be the highest. This is because when the current density or the like is switched stepwise, the additive such as a leveler existing near the wafer is abruptly taken in the plating film. If the boundary exists in the wiring groove, there is the fear that the crystal defect moving in the direction of the surface from the lower portion due to crystal grain growth stays near the boundary. For this, in this embodiment, the current density or the like is switched when the plating film 4 is formed to the position at the height of the depth of the first layer wiring groove 1a or larger from the bottom surface of the first layer wiring groove 1a, and therefore, formation of the above described boundary in the first layer wiring groove 1a can be suppressed. Thereby, the crystal defect can be effectively swept out from inside the first layer wiring groove 1a. When the current density or the like is switched when the plating film 4 is formed at the position at the height 1.2 times as large as or larger than the depth of the first layer wiring groove 1a from the bottom surface of the first layer wiring groove 1a, formation of the above described boundary in the first layer wiring groove 1a can be reliably suppressed.

Second Embodiment

A second embodiment will be described hereinafter. In this embodiment, an example of forming a plating film while continuously reducing a current density or applied voltage will be described.

A semiconductor device of this embodiment has the same structure as that in FIG. 17, but the impurity concentration of the first layer wiring 6 becomes gradually higher to the upper portion 4a from the lower portion 4b. The impurity concentrations of the via plug 13 and the second layer wiring 14 are the same as that of the first layer wiring 6.

Such a semiconductor device can be formed by the following process. In this embodiment, the process steps other than those of forming the plating films 4 and 11 are the same as in the first embodiment, and therefore, the explanation of the process steps other than those of forming the plating films 4 and 11 will be omitted.

In the case of electrolytic plating with current control, the plating film 4 is formed while the current density is continuously reduced. In the case of electrolytic plating with voltage control, the plating film 4 is formed while the applied voltage is continuously reduced. The plating film 4 may be formed while the rotational frequency of the wafer W is continuously increased with continuously reducing the current density or applied voltage, or instead of it. If the plating film 4 is formed as described above, the impurity concentration of the first layer wiring 6 can be made gradually higher to the upper portion 4a from the lower portion 4b. The plating film 11 is formed by the same method of the plating film 4.

In this embodiment, the plating film 4 is formed while the current density or the like is continuously changed, and therefore, the impurity concentration of the upper portion 4a of the plating film 4 can be made higher than the impurity concentration of the lower portion 4b. Thereby, the same effect as that in the first embodiment can be obtained.

In this embodiment, the impurity concentration of the plating film 4 in the wiring groove 1a is increased. As a result, even when the crystal defect such as a vacancy remains in the wiring groove 1a to some extent, the vacancy is stabilized in the plating film based on the trap effect by the impurities, and void formation by accumulation of the vacancy is suppressed. When the impurity concentration of the plating film 4 in the wiring groove 1a is increased, and the concentration difference from the impurity concentration of the plating film 4 outside the wiring groove 1a becomes small, sweeping out the crystal defect to outside the wiring groove 1a from inside the wiring groove 1a tends to be relieved. Here, as a result that the impurity concentration in the first layer wiring 6 becomes gradually higher from the lower portion 4b to the upper portion 4a in this embodiment, sweeping out the crystal defect to outside the wiring groove 1a easily proceeds without hindrance even if the impurity concentration difference between the inside of the wiring groove 1a and the outside of the wiring groove 1a becomes small to some extent. Therefore, EM reliability and SM reliability can be enhanced, and a semiconductor device with reliability of the wiring secured can be provided.

Examples 1 and 2, and Comparative Example 1

Hereinafter, examples 1 and 2, and a comparative example 1 will be described. In the examples 1 and 2, and the comparative example 1, the SM acceleration test was conducted, the percent defective was measured and the physical analysis of the Cu wiring was made. The impurity concentration analysis of the Cu wiring films before removal of the unnecessary portions by CMP was made, and in the examples 1 and 2, the crystal grain analysis was made.

In the examples 1 and 2, and the comparative example 1, the wafers formed by the following process were used. After the oxide film was formed to 15 nm on the Si substrate having the active part, the SiOC low dielectric constant insulating film (interlayer insulating film) was formed to 250 nm by a CVD method. Thereafter, by a lithography process and a RIE process, the first layer wiring groove of a width of 5 μm and a depth of 250 nm was formed.

Then, after resist removal was performed by an ashing process, it was cleaned and degassing treatment at 250° C. was performed under the hydrogen atmosphere. Thereafter, the Ta film (barrier metal film) is formed to 15 nm by an SIS (Self Ionized Sputter) sputtering method, and then, the Cu seed film (seed film) was formed to 70 nm by an SIS sputtering method.

After the Cu seed film was formed, the Cu plating film (plating film) was formed by an electrolytic plating method. The Cu plating film was formed by the different methods in the examples 1 and 2 and the comparative example 1, respectively. In concrete, in the example 1, the wafer rotational frequency was made constant, and the Cu plating film was formed with the current density of 0.1 A/cm$^2$ to the position at the height 1.2 times as large as the depth of the first layer wiring groove from the bottom surface of the first layer wiring groove (first step). Thereafter, it was formed with the current density of 0.03 A/cm$^2$ to the position at the height 1.5 times as large as the depth of the first wiring groove from the bottom surface of the first layer wiring groove (second step). In the example 2, the current density was fixed to 0.1 A/cm$^2$, and the Cu plating film was formed at the wafer rotational frequency of 25 rpm to the position at the height 1.2 times as large as the depth of the first layer wiring groove from the bottom surface of the first layer wiring groove (first step). Thereafter, it was formed at the wafer rotational frequency of 125 rpm to the position at the height 1.5 times as large as the depth of the first layer wiring groove from the bottom surface of the first layer wiring groove (second step). In the comparative example 1, the wafer rotational frequency was made constant, and the Cu plating was formed with the current density of 0.03 A/cm$^2$ (first step). Thereafter, the Cu plating film was formed with the current density of 0.1 A/cm$^2$ (second step), and thereafter, it was formed with the current density of 0.32 A/cm$^2$ to the position at the height 1.5 times as large as the depth of the first layer wiring groove from the bottom surface of the first layer wiring groove (third step).

Subsequently, each of these wafers with the Cu plating film formed thereon was thermally treated at 150° C. in the forming gas with a hydrogen concentration of about 10 vol % for 60 minutes, and the Cu wiring film (wiring film) was formed. Thereafter, unnecessary Cu wiring film and the like were removed by CMP, and the first layer Cu wiring was formed.

Next, the SiC film (cap film) was formed to 60 nm by a plasma CVD method, and thereafter, the SiOC low dielectric constant insulating film (interlayer insulating film) was formed to 800 nm by a CVD method. Thereafter, by the lithography process and the RIE process, the via hole with a diameter of 0.13 nm was formed, and subsequently, the second layer wiring groove of a width of 0.2 μm and a depth of 300 nm was formed. After the resist removal was performed by the ashing process, the SiC film existing directly on the first layer Cu wiring is opened, and each of the wafers was cleaned.

Thereafter, degassing treatment was performed in the sputtering device, and due to the purpose of the SM acceleration test, as the degassing treatment, a large amount of void generates in the first layer Cu wiring, and therefore, the thermal treatment was performed at 350° C. for 60 seconds under the decompressed hydrogen atmosphere.

Subsequently, by an SIS (Self Ionized Sputter) sputtering method, the Ta film (barrier metal film) was formed to 15 nm, and then, a Cu seed film (seed film) was formed to 80 nm by an SIS sputtering method.

After the Cu seed film was formed, a Cu plating film (plating film) was formed by an electrolytic plating method. The Cu plating film was each formed by the same method as described above.

These wafers with the Cu plating films formed thereon were thermally treated at 150° C. for 60 minutes in a forming gas with a hydrogen concentration of about 10 vol %, and the Cu wiring films were formed, after which, unnecessary Cu wiring films and the like were removed by CMP, and the Cu via plugs and second layer Cu wirings were formed.

Next, the SiC films (cap films) were formed to 70 nm by a plasma CVD method, and thereafter, the passivation films were formed. The passivation films were each constituted of a d-TEOS film with a thickness of 400 nm and a p-SiN film of a thickness of 600 nm. Finally, an Al pad process step was performed, and the electrode pads were formed on the surfaces so as not to allow the second Cu wirings to contact atmosphere.

By the above process, the two layers of Cu wirings were formed. The Cu wirings which were subjected to the SM acceleration test included two level interconnects with 10M number of via, and were each of a single via structure with a width of the first layer Cu wiring of 5 μm, a width of the second layer Cu wiring of 0.2 μm, and a length of 10 μm. This structure is the structure in which a so-called void defect which becomes a problem in Cu wirings occurs the most frequently.

The wafers of the examples 1 and 2 and the comparative example 1 formed by the above process were left at 175° C. for 1000 hours as the SM acceleration test. After the test, physical analysis was made.

For the Cu wiring films before CMP, the impurity concentrations in the Cu wiring films were measured by the back side SIMS (Secondary Ion-microprobe Mass Spectrometer). In the examples 1 and 2, the crystal grain analysis of the sections of the Cu wirings was made.

The result will be described hereinafter. As a result of the SM acceleration test, a defect of 10% was detected in the comparative example 1, whereas no defect was detected in the examples 1 and 2. As a result of the physical analysis, voids were observed directly under the Cu via plug in the comparative example 1, whereas in the examples 1 and 2, no void was observed directly under the Cu via plugs.

As a result of the impurity concentration analysis, in the comparative example 1, the impurity concentration in the Cu wiring film became gradually lower toward the upper portion, and in the examples 1 and 2, the impurity concentrations in the Cu wiring films became gradually higher toward the upper portions. As a result of the crystal grain analysis of the Cu wiring film sections, it was observed that in the examples 1 and 2, the crystal grain grew from the lower portion, polycrystals smaller than those in the lower portions distributed near the surfaces, and microscopic voids distributed in them.

From these results, it was confirmed that by forming the Cu plating film while reducing the current density or increasing the rotational frequency of the wafer, the impurity concentration in the Cu wiring film became higher in the upper portion than in the lower portion. By this, it has been confirmed that the crystal grain of the Cu plating film grow from the lower portion, the crystal defect is swept out to the CMP removal region in the wiring upper portion, and reliability of the Cu wiring is increased.

Examples 3 to 9 and Comparative Examples 2 and 3

Hereinafter, examples 3 to 9 and comparative examples 2 and 3 will be described. In the examples 3 to 9 and comparative examples 2 and 3, the impurity concentrations, the defect amounts of the Cu wirings, and the SIV percent defectives were measured.

The examples 3 to 9 and the comparative example 2 differ from one another in the current densities in the first and second steps on forming the Cu plating film, and the film thickness of the Cu plating film in the first step. In the comparative example 3, the Cu plating film was formed under the same conditions in the first step and the second step. The wiring structures of the examples 3 to 9 and the comparative examples 2 and 3 are the same as in the examples 1, 2 and the like.

Figure 19:
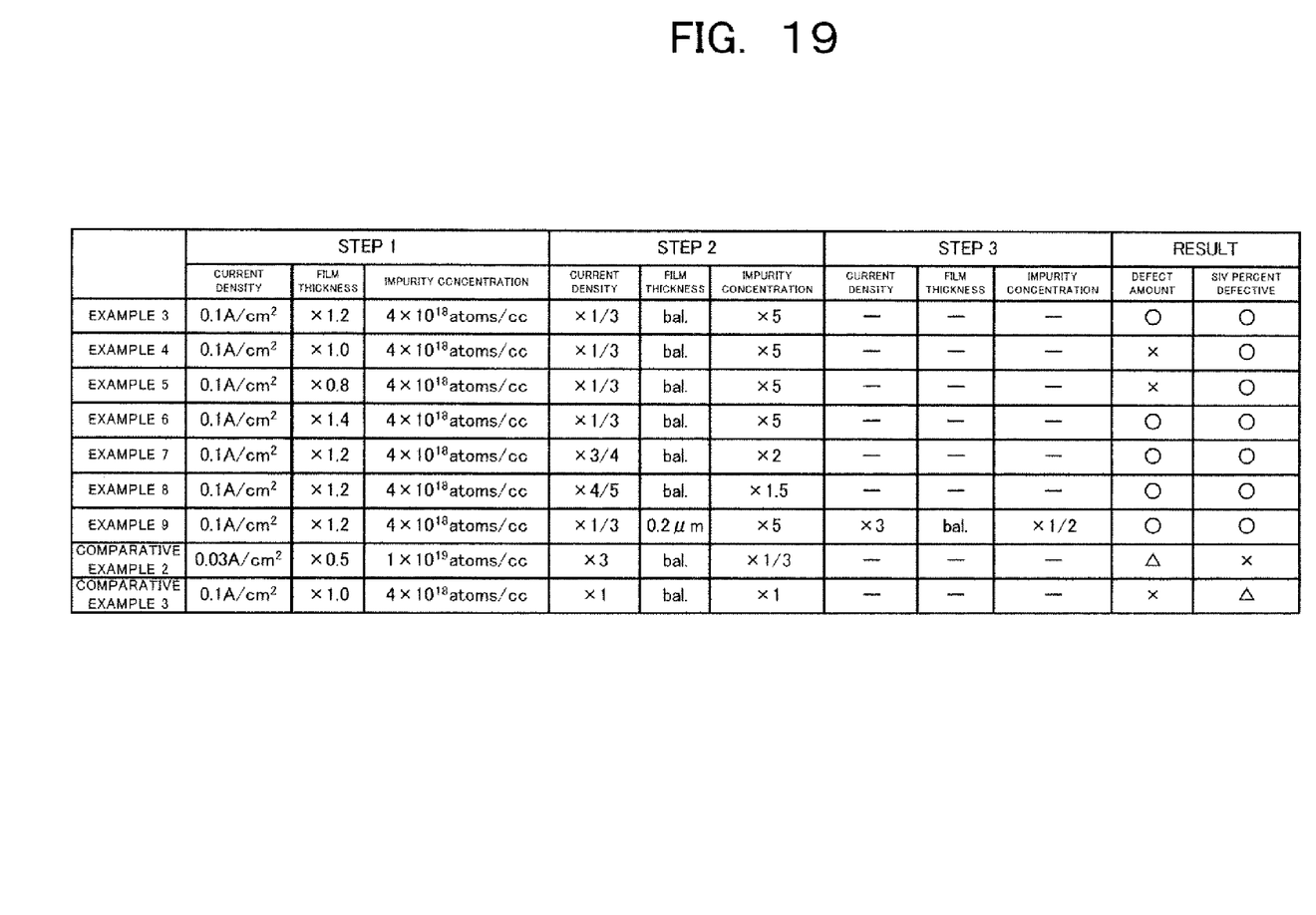
FIGS. 19 and 20 are tables showing the results of carrying out embodiments of the present invention.

Hereinafter, the result will be described. In FIG. 19, the film thickness of the Cu plating film in the first step 1 is the burying ratio with respect to the depth of the wiring groove, the current densities and the impurity concentrations in the second step and the third step are the ratios with respect to the current density and the impurity concentration in the first step, and "bal" expresses the balance. "the circle, the triangle, and the cross" in the defect amount in the Cu wiring express "5/μm or less, from more than 5/μm to 10/μm inclusive, and more than 10/μm", respectively. Further, "the circle, the triangle, and the cross" in the SIV percent defective express "no defect, 1% or less, and more than 1%" respectively.

As shown in FIG. 19, the SIV defects occurred to the Cu wirings in the comparative examples 2 and 3, but SIV defects did not occur in the examples 3 to 9. From the result, it has been confirmed that by reducing the current density in the second step to be lower than the current density in the first step, the SIV defect can be suppressed.

As a result of observing the section of the Cu wiring film of a different sample formed by the method of the comparative example 2 by the TEM (Transmission Electron Microscopy), the trace of the crystal grain growing from the upper portion was observed, and the boundary portion from the small crystals of the lower portion was confirmed in the upper portion in the wiring groove. As a result of observing the section of the Cu wiring film by the TEM in the comparative example 3, the trace of most of the crystal grain growing from the upper portion was observed. From these results, it has been confirmed that in the portion with a high impurity concentration, crystal grain growth is suppressed, and when the impurity concentration of the Cu plating film is uniform, the crystal grain growth advances with a different kind of substance such as an oxide as a starting point.

Whereas in each of the examples 4 and 5, 10 μm or more of crystal defects occurred to the Cu wirings, 5/μm or less of crystal defects of the Cu wirings occurred in each of the examples 3, and 6 to 9. From the result, it has been confirmed that the plating film is preferably formed at least to the position at the height 1.2 times as large as or larger than the depth of the wiring groove from the bottom surface of the wiring groove in the first step.

In each of the examples 3 to 9, an SIV defect did not occur as described above, and the impurity concentration in the second step at this time was 1.5 times as high as or higher than the impurity concentration in the first step. From the result, it has been confirmed that by making the impurity concentration in the second step 1.5 times as high as or higher than the impurity concentration in the first step, recrystallization of the crystal grain occurs from the lower portion of the Cu wiring and reliability of the Cu wiring increases.

It is conceivable that by reducing the current density in the second step, the deposition speed reduces, and throughput reduces. Therefore, in the example 9, the third step in which the current density is higher than in the second step was performed in order to enhance throughput, and it has been confirmed that there is no problem if the current density in the second step is low with respect to the current density in the first step. From the result, it has been confirmed that when the third step in which the current density is higher than in the second step is performed after the second step, the same effect as in the examples 3 to 8 is obtained and throughput is enhanced.

Examples 10 to 15

Hereinafter, examples 10 to 15 will be described. In the examples 10 to 15, the impurity concentrations, the crystal defect amounts of the Cu wirings, and the SIV percent defectives were measured.

The examples 10 to 15 differ from one another in the wafer rotational frequency in the first and second steps on forming the Cu plating film, and the film thickness of the Cu plating film in the first step. The wiring structures of the examples 10 to 15 are the same as in the examples 1, 2 and the like.

Figure 20:
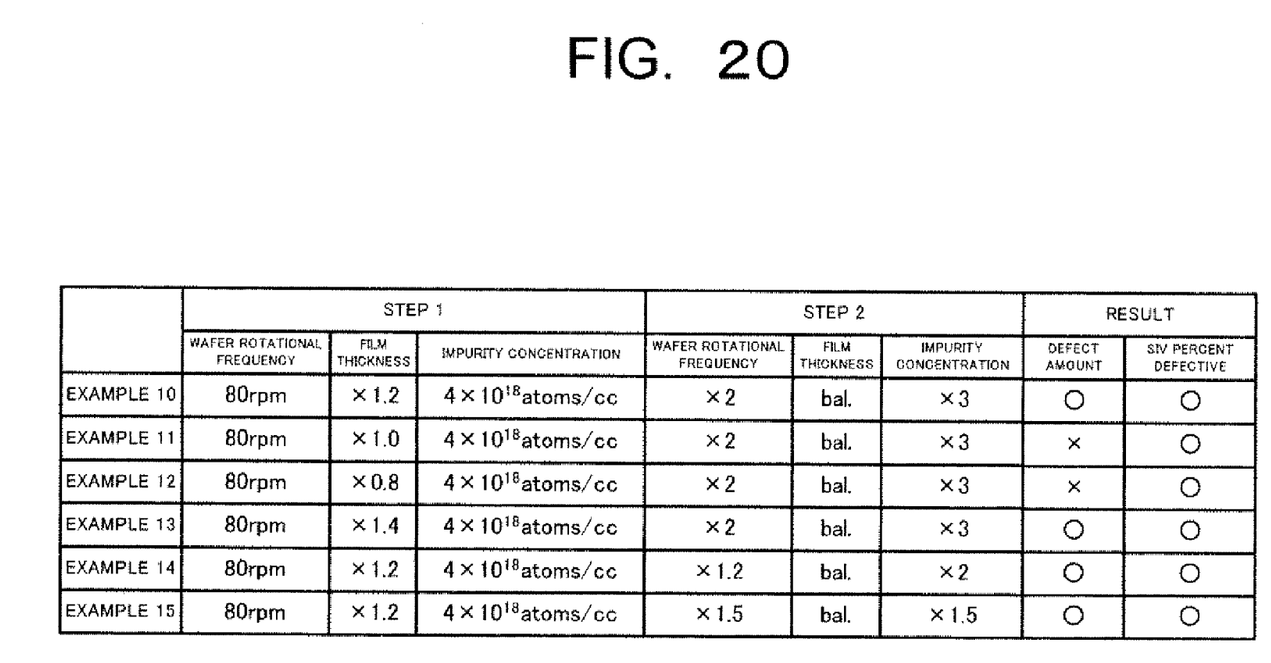

Hereinafter, the result will be described. In FIG. 20, the film thickness of the Cu plating film in the first step is the burying ratio with respect to the depth of the wiring groove, the wafer rotational frequencies and the impurity concentrations in the second step are the ratios with respect to the wafer rotational frequencies and the impurity concentrations in the first step, and "bal" expresses the balance. "the circle, the triangle, and the cross" in the defect amount in the Cu wiring express "5/µm or less, from more than 5/µm to 10/µm inclusive, and more than 10/µm", respectively. Further, "the circle, the triangle, and the cross" in "SIV percent defective" express "no defect, 1% or less, and more than 1%" respectively.

As shown in FIG. 20, an SIV defect did not occur in the examples 10 to 15. From the result, it has been confirmed that by making the wafer rotational frequency in the second step higher than the wafer rotational frequency in the first step, occurrence of an SIV defect can be suppressed.

Whereas in each of the examples 11 and 12, 10/µm or more of crystal defects occurred to the Cu wiring, 5 µm or less of crystal defects of the Cu wiring occurred in each of the examples 10, and 13 to 15. From the result, it has been confirmed that the plating film is preferably formed at least to the position at the height 1.2 times as large as or larger than the depth of the wiring groove from the bottom surface of the wiring groove in the first step.

Examples 16 and 17

Hereinafter, examples 16 and 17 will be described. In the examples 16 and 17, the impurity concentrations, the crystal defect amounts of the Cu wirings and the SIV percent defectives were measured.

In the example 16, the current density on the occasion of forming the Cu plating film was continuously lowered, and in the example 17, the wafer rotational frequency on the occasion of forming the Cu plating film was continuously increased. The wiring structures of the examples 16 and 17 are the same as in the examples 1, 2 and the like.

The result will be described hereinafter. In the examples 16 and 17, substantially the same effect as in the examples 3 to 15 was obtained. As a result of studying the various conditions, it has been found out that when the difference in the impurity concentration which is 1.2 times or larger occurs, the effects in the crystal defect amount and the SIV percent defective are obtained. From the result, it has been confirmed that the above described effects can be obtained even when the current density on the occasion of forming the Cu plating film is continuously reduced, or when the wafer rotational frequency is continuously increased.

Other Examples

The present invention is not limited to the description content of the above described embodiments, and the structure, material and disposition or the like of each of the components can be properly changed in the scope without deviating from the gist of the present invention. For example, the two-layer wiring is described in the above described embodiments, but a single-layer wiring or wirings of three layers or more may be adopted.

In the above described embodiments, the current density or the applied voltage is decreased stepwise or continuously, or the rotational frequency of the wafer W is increased stepwise or continuously. As a result of this, a deposition speed of the plating film 4 is controlled to be decreased to form a plating film 4 in which the impurity concentration of the upper portion 4a is higher than the impurity concentration of the lower portion 4b. But the plating film may be formed by the other methods, as long as the impurity concentration of the upper portion 4a of the plating film 4 can be made higher than the impurity concentration of the plating film lower portion 4b. As the other methods, for example, replacing the plating bath, and replacing the plating solution during formation of the plating film 4 are cited.

What is claimed is:

1. A method for manufacturing a semiconductor device, comprising:
    preparing a substrate having a recessed portion on a surface;
    forming a plating film to bury the recessed portion, the plating film having a lower portion and an upper portion, including a higher impurity concentration in the upper portion than in the lower portion, and a boundary of the lower portion and the upper portion being at a height 1.2 times as large as or larger than a depth of the recessed portion from a bottom surface of the recessed portion;
    thermally treating the plating film; and
    removing the thermally treated plating film except for a portion buried in the recessed portion.

2. The method for manufacturing a semiconductor device according to claim 1, wherein the plating film is a copper plating film, and a temperature of the thermal treatment is from 150° C. to 300° C. inclusive.

3. The method for manufacturing a semiconductor device according to claim 1, wherein the impurity concentration in the upper portion of the plating film is 1.2 times as high as or higher than the impurity concentration in the lower portion of the plating film.

4. The method for manufacturing a semiconductor device according to claim 1, wherein the plating film is formed by electrolytic plating with a current density or applied voltage reduced continuously or stepwise.

5. The method for manufacturing a semiconductor device according to claim 4, wherein the plating film is formed by electrolytic plating with the current density or the applied voltage switched stepwise, in a position at the height 1.2 times as large as or larger than the depth of the recessed portion from the bottom surface of the recessed portion.

6. The method for manufacturing a semiconductor device according to claim 5, wherein a plurality of the recessed portions exist, and for all of plurality of the recessed portions, the current density or the applied voltage is switched stepwise in the position at the height 1.2 times as large as or larger than the depth of the recessed portions from the bottom surfaces of the recessed portions.

7. The method for manufacturing a semiconductor device according to claim 1, wherein the plating film is formed while the substrate is rotated, and its rotational frequency is increased continuously or stepwise.

8. The method for manufacturing a semiconductor device according to claim 7, wherein the rotational frequency of the substrate is switched stepwise in a position at the height 1.2 times as large as or larger than the depth of the recessed portion from the bottom surface of the recessed portion.

9. The method for manufacturing a semiconductor device according to claim 8, wherein a plurality of the recessed portions exist, and for all of plurality of the recessed portions, the rotational frequency of the substrate is switched stepwise in the position at the height 1.2 times as large as or larger than the depth of the recessed portions from the bottom surfaces of the recessed portions.

10. The method for manufacturing a semiconductor device according to claim 1, wherein the impurity includes at least one of S, Cl, O, C, and N.

* * * * *